(12) United States Patent
Kasai

(10) Patent No.: US 9,997,585 B2
(45) Date of Patent: Jun. 12, 2018

(54) ELECTRO-OPTICAL DEVICE, DRIVING METHOD OF ELECTRO-OPTICAL DEVICE, AND ELECTRONIC APPARATUS

(71) Applicant: SEIKO EPSON CORPORATION, Tokyo (JP)

(72) Inventor: Toshiyuki Kasai, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 48 days.

(21) Appl. No.: 15/084,706

(22) Filed: Mar. 30, 2016

(65) Prior Publication Data

US 2016/0211315 A1 Jul. 21, 2016

Related U.S. Application Data

(63) Continuation of application No. 13/557,780, filed on Jul. 25, 2012, now Pat. No. 9,330,588.

(30) Foreign Application Priority Data

Jul. 29, 2011 (JP) ................................. 2011-166576
May 1, 2012 (JP) ................................. 2012-104847

(51) Int. Cl.
*G09G 3/32* (2016.01)
*H01L 27/32* (2006.01)
*G09G 3/00* (2006.01)
*G09G 3/3233* (2016.01)

(52) U.S. Cl.
CPC ......... *H01L 27/3276* (2013.01); *G09G 3/003* (2013.01); *G09G 3/3233* (2013.01); *H01L 27/3211* (2013.01); *H01L 27/3262* (2013.01); *G09G 2300/0842* (2013.01); *G09G 2320/0214* (2013.01)

(58) Field of Classification Search
CPC ................. G09G 3/003; G09G 3/3233; G09G 2300/0842; G09G 2320/0214
See application file for complete search history.

(56) References Cited

U.S. PATENT DOCUMENTS

| 5,247,289 A * | 9/1993 | Matsueda ......... G02F 1/136213 345/98 |
|---|---|---|
| 5,412,493 A | 5/1995 | Kunii et al. |
| 6,859,193 B1 | 2/2005 | Yumoto |
| 7,764,101 B2 | 7/2010 | Wu et al. |
| 2004/0233147 A1 | 11/2004 | Kawachi et al. |
| 2006/0114200 A1 | 6/2006 | Yamashita et al. |
| 2007/0080905 A1 | 4/2007 | Takahara |
| 2007/0097756 A1 | 5/2007 | Hirota et al. |
| 2007/0236440 A1 | 10/2007 | Wacyk et al. |

(Continued)

FOREIGN PATENT DOCUMENTS

| CN | 101038788 A | 9/2007 |
|---|---|---|
| CN | 101996580 A | 3/2011 |

(Continued)

*Primary Examiner* — Jung Kim
(74) *Attorney, Agent, or Firm* — Oliff PLC

(57) ABSTRACT

A pixel circuit includes a driving transistor, a switching transistor, and a light emitting element, and the light emitting elements are formed on a semiconductor substrate. A first substrate potential is supplied to the switching transistor, and a second substrate potential, different from the first substrate potential, is supplied to the driving transistor.

20 Claims, 15 Drawing Sheets

(56) References Cited

U.S. PATENT DOCUMENTS

| | | | |
|---|---|---|---|
| 2007/0247213 A1* | 10/2007 | Kapoor | H01L 27/0629 327/534 |
| 2008/0225061 A1 | 9/2008 | Kimura et al. | |
| 2010/0289832 A1 | 11/2010 | Yamamoto et al. | |

FOREIGN PATENT DOCUMENTS

| | | |
|---|---|---|
| JP | H06-265940 A | 9/1994 |
| JP | 2002-198536 A | 7/2002 |
| JP | 2005-208589 A | 8/2005 |
| JP | 2005-234242 A | 9/2005 |
| JP | 2006-154521 A | 6/2006 |
| JP | 2008-134625 A | 6/2008 |
| JP | 2009-152113 A | 7/2009 |
| JP | 2010-266490 A | 11/2010 |
| WO | 01/06484 A1 | 1/2001 |
| WO | 2004/100118 A1 | 11/2004 |

* cited by examiner

V4 IS LOWER POTENTIAL THAN SOURCE OF Tr122 OR V4 IS LOWER POTENTIAL THAN V3

$V3 \leq V2 + Voled\_th$

Tr122: Nch
Tr125: Nch

ELECTRO-OPTICAL DEVICE, DRIVING METHOD OF ELECTRO-OPTICAL DEVICE, AND ELECTRONIC APPARATUS

This is a Continuation of application Ser. No. 13/557,780 filed Jul. 25, 2012, which claims the benefit of Japanese Patent Application No. 2011-166576 filed Jul. 29, 2011 and Japanese Patent Application No. 2012-104847 filed May 1, 2012. The disclosure of the prior applications is hereby incorporated by reference herein in its entirety.

BACKGROUND

1. Technical Field

The present invention relates to an electro-optical device that integrates a pixel circuit, for example, on a semiconductor substrate, a driving method of an electro-optical device, and an electronic apparatus.

2. Related Art

In recent years, a variety of electro-optical devices using a light emitting element such as an organic light emitting diode (hereinafter, referred to as "OLED") element, and the like have been proposed. Generally, in the electro-optical device, scan lines and data lines are wired on a glass substrate, and a pixel circuit is formed according to intersections of the scan lines and the data lines. In the pixel circuit, apart from the light emitting element, a switching transistor turned on by selection of the scan lines, or a driving transistor for enabling a current according to holding potential to flow to the light emitting element may be included. Since the pixel circuit is formed on the glass substrate, the switching transistor or the driving transistor generally includes a thin-film transistor.

Meanwhile, in recent years, techniques for forming this kind of the electro-optical device on a semiconductor substrate such as a silicon substrate is different from the glass substrate, have been proposed (For example, see U.S. Patent Application Publication No. 2007/0236440, and JP-A-2009-152113).

However, when forming the pixel circuit on the semiconductor substrate, problems are generated compared to a case of forming the pixel circuit on the glass substrate.

SUMMARY

An advantage of some aspects of the invention is to provide an electro-optical device that considers problems generated when forming a pixel circuit on a semiconductor substrate, a driving method of the electro-optical device, and electronic apparatus.

According to an aspect of the invention, there is provided an electro-optical device in which a scan line, a data line, and a pixel circuit are formed on a semiconductor substrate, wherein the pixel circuit includes a light emitting element having a first electrode and a second electrode, a driving transistor that controls a current in accordance with a potential of a gate node while being electrically connected to the first electrode of the light emitting element during a period when the current is supplied to the light emitting element, and a switching transistor that is electrically connected between the gate node of the driving transistor and the data line, wherein a first substrate potential is supplied to the switching transistor, and wherein a second substrate potential different from the first substrate potential is supplied to the driving transistor.

In the electro-optical device, when forming the pixel circuit including the switching transistor and the driving transistor on the semiconductor substrate, a substrate potential may be determined based on a role required for each transistor. For this reason, it is possible to minimize effects of a leakage, or the like of the switching transistor compared to a configuration in which the substrate potential simply coincides with a source potential.

In the electro-optical device, when the switching transistor is an N-channel transistor, it is preferable that the first substrate potential be lower than a source potential of the switching transistor, and lower than a minimum value of the source potential.

Meanwhile, in the electro-optical device, when the switching transistor is a P-channel transistor, it is preferable that the first substrate potential be higher than a source potential of the switching transistor, and higher than a maximum value of the source potential.

According to another aspect of the invention, there is provided an electro-optical device in which a scan line, a data line, and a pixel circuit are formed on a semiconductor substrate, wherein the pixel circuit includes a light emitting element having a first electrode and a second electrode, an N-channel driving transistor that controls a current in accordance with a potential of a gate node while being electrically connected to the first electrode of the light emitting element during a period when the current is supplied to the light emitting element, and an N-channel switching transistor that is electrically connected between the gate node of the driving transistor and the data line, wherein a first substrate potential is supplied to the switching transistor, wherein a second substrate potential different from the first substrate potential is supplied to the driving transistor, and wherein the first substrate potential is lower than the second substrate potential. In the electro-optical device, it is possible to minimize effects of a leakage, or the like of the switching transistor.

According to still another aspect of the invention, there is provided an electro-optical device in which a scan line, a data line, and a pixel circuit are formed on a semiconductor substrate, wherein the pixel circuit includes a light emitting element having a first electrode and a second electrode, a P-channel driving transistor that controls a current in accordance with a potential of a gate node while being electrically connected to the first electrode of the light emitting element during a period when the current is supplied to the light emitting element, and a P-channel switching transistor that is electrically connected between the gate node of the driving transistor and the data line, wherein a first substrate potential is supplied to the switching transistor, wherein a second substrate potential different from the first substrate potential is supplied to the driving transistor, and wherein the first substrate potential is higher than the second substrate potential. In the electro-optical device, it is possible to minimize effects of a leakage, or the like of the switching transistor.

In the electro-optical device, the light emitting element and the driving transistor may be connected in series between the first potential and the second potential, and the second substrate potential may be a common potential with a source node of the driving transistor.

In the electro-optical device, the pixel circuit may further include a power supply line for supplying the first potential, one of a source node and a drain node of the driving transistor may be connected to the first electrode of the light emitting element so that the second potential different from the first potential is supplied to the second electrode of the light emitting element, the other of the source node and the drain node of the driving transistor may be connected to the power supply line, and the first substrate potential may be lower than the second potential.

Here, the light emitting element and the driving transistor may be connected in series between the first potential and the second potential, and the second substrate potential may be a common potential with one of the first potential and the second potential.

In the electro-optical device, the pixel circuit may further include a power supply line for supplying the first potential, one of a source node and a drain node of the driving transistor may be connected to the first electrode of the light emitting element, the other of the source node and the drain node of the driving transistor may be connected to the power supply line, and a third substrate potential common with the first potential may be supplied to the driving transistor.

In the electro-optical device, the driving transistor may be obtained by connecting, in series, at least two transistors to which a gate is connected in common, and the second substrate potential may be supplied to the at least two transistors. Here, even though a power supply voltage is increased, it is unnecessary to increase a withstand voltage of the transistor.

In the electro-optical device, one of a source node and a drain node of the switching transistor may be connected to the data line, and the gate node of the switching transistor may be connected to the scan line.

In the electro-optical device, the pixel circuit may further include a capacitive element, and one of a source node and a drain node of the switching transistor may be connected to an end of the capacitive element and the gate node of the driving transistor. Here, the current flowing in the light emitting element may be a current according to a voltage held by the capacitive element. In addition, the current flowing in the light emitting element may be a current according to a voltage between a gate and a source of the driving transistor.

In the electro-optical device, the switching transistor may electrically connect the gate node of the driving transistor and the data line when the scan line is selected, and a scan line driving circuit for driving the scan line and a data line driving circuit for driving the data line may be formed on the semiconductor substrate together with the pixel circuit. Here, a separation well may be formed between a display unit in which the pixel circuit is provided and a peripheral circuit in which the scan line driving circuit and the data line driving circuit are provided. In this manner, by forming the separation well, it is possible to minimize the influences of an operation of the peripheral circuit on the display unit.

In addition, the invention may be applied to a driving method of the electro-optical device and electronic apparatus including the electro-optical device, in addition to the electro-optical device. As typical examples of the electronic apparatus, a display apparatus such as a head mounted display, and an electronic viewfinder may be given.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings.

Figure 1:
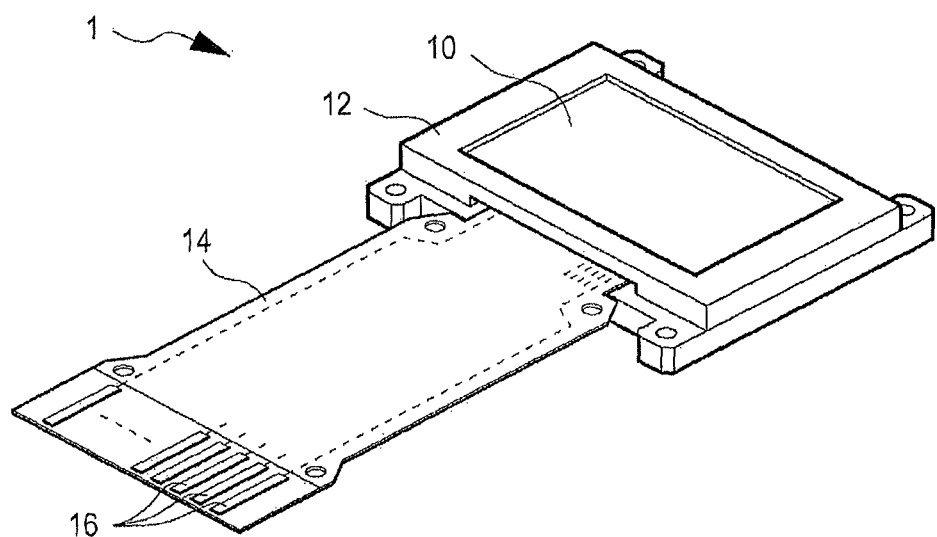
FIG. 1 is a perspective view illustrating an electro-optical device according to an embodiment of the invention.

FIG. 1 is a perspective view illustrating an electro-optical device 1 according to an embodiment of the invention.

The electro-optical device 1 shown in FIG. 1 includes a micro display 10 which is applied to a head mounted display (HMD) to display an image. The micro display 10 is an organic EL device in which a plurality of pixel circuits, a peripheral circuit for driving a corresponding pixel circuit, and the like are formed on a semiconductor substrate represented by a silicon substrate, and an OLED is included in the pixel circuit. In addition, in the invention, a silicon substrate is illustrated as the semiconductor substrate, but a semiconductor substrate made of a material that is well known in the related art may be applicable in the invention.

The micro display 10 is housed in a frame-like case 12 which is opened in a display unit, and is connected to an end of an FPC (Flexible Printed Circuit) substrate 14. A plurality of terminals 16 are provided in the other end of the FPC substrate 14, and are connected with a circuit module which is not shown. In addition, the circuit module connected with the terminal 16 serves as a power circuit and a control circuit of the micro display 10 to feed a variety of potentials through the FPC substrate 14 and supply a data signal, a control signal, or the like.

Figure 2:
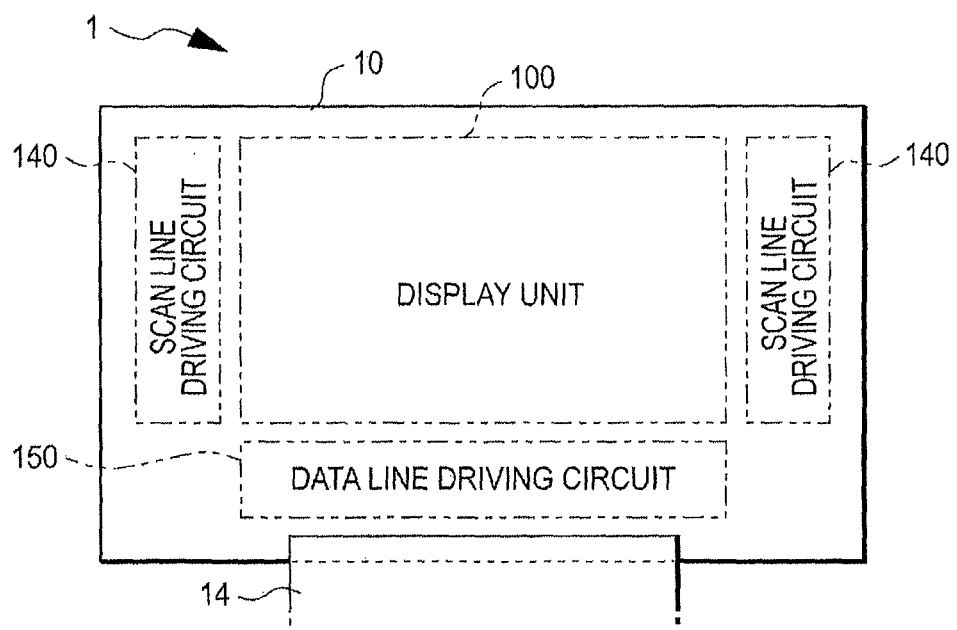
FIG. 2 is a plane view illustrating disposition of each component in an electro-optical device.
Figure 3:
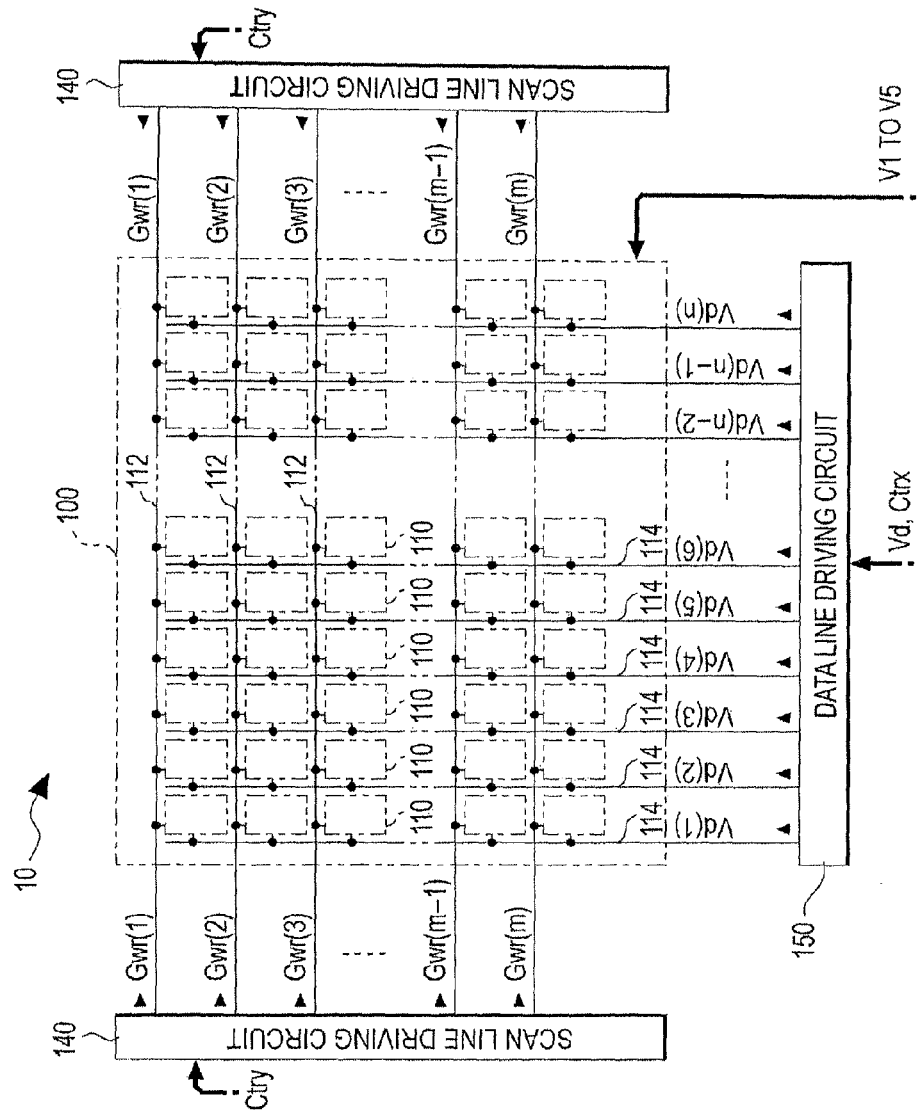
FIG. 3 is a block diagram illustrating an electrical configuration of an electro-optical device.

FIG. 2 is a plane view illustrating disposition of each component in the electro-optical device 10, and FIG. 3 is a block diagram illustrating an electrical configuration of the electro-optical device 10. In addition, in FIG. 2, for convenience of description, a state in which the case 12 of FIG. 1 is removed is illustrated.

In FIG. 2, a display unit 100 is formed in an oblong rectangle in a lateral direction, which is less than one inch of a diagonal when viewed in a plane. Specifically, in FIG. 3, in the display unit 100, scan lines 112 in m rows are provided in a lateral direction in the figure, and data lines 114 in n columns are provided in a vertical direction so as to keep mutual electrical insulation relation with each of the scan lines 112. The plurality of pixel circuits 110 are arranged in a matrix shape according to each of intersections of the scan lines 112 in m rows and the data lines 114 in n columns.

Here, m and n are all natural numbers. In addition, for the sake of convenience to distinguish rows of a matrix of the scan lines 112 and the pixel circuits 110, 1, 2, 3, . . . , (m−1), and m-th rows are referred in this order from above in FIG. 3. In the similar manner, for the sake of convenience to distinguish columns of a matrix of the data lines 114 and the pixel circuits 110, 1, 2, 3, . . . , (n−1), and n-th columns are referred in this order from the left in FIG. 3.

In addition, in practice, three pixel circuits 110 corresponding to intersections with the data lines 114 in three columns mutually adjacent to the scan lines 112 in the same rows represent one dot of a color image to be displayed, and correspond to each of pixels of R (red), G (Green), and B (Blue). In other words, in the present embodiment, a one-dot color is represented by additive color mixing of a light emitting element of the three pixel circuits 110 of RGB.

In a periphery of the display unit 100, periphery circuits for driving the pixel circuits 110 are provided. The periphery circuit includes a scan line driving circuit 140 and a data line driving circuit 150, and the scan line driving circuit 140 is provided on both sides of left and right with respect to the display unit 100. Specifically, as shown in FIG. 3, two scan line driving circuits 140 drive each of the scan lines 112 in m lines from both sides.

The same control signal Ctry is supplied to each of the scan line driving circuits 140 from the circuit module, and the same scanning signals Gwr(1), Gwr(2), Gwr(3), . . . , Gwr(m−1), and Gwr(m) are supplied to each of 1, 2, 3, . . . , (m−1), and m-th scan lines 112.

In addition, at the time of this supply, when delay of the scanning signals does not cause a problem, only one scan line driving circuit 140 may be provided on one side.

As shown in FIG. 2, the data line driving circuit 150 is provided between a connection location of the FPC substrate 14 and the display unit 100. As shown in FIG. 3, an image signal Vd and a control signal Ctrx are supplied from the circuit module to the data line driving circuit 150. The data line driving circuit 150 supplies the image signal Vd to 1, 2, 3, . . . , (n−1), and n-th data lines 114 in accordance with the control signal Ctrx, as the data signals Vd(1), Vd(2), Vd(3), . . . , Vd(n−1), and Vd(n).

In addition, in the display unit 100, potentials V1 to V5 are supplied to each of the pixel circuits 110 from the circuit module through the FPC substrate 14. In addition, in the present embodiment, among the potentials V1 to V5, the potentials V1, V2, and V4 are supplied.

The pixel circuit 110, the scan line driving circuit 140, and the data line driving circuit 150 are formed on a common silicon substrate. Among these, the scanning signals Gwr(1) to Gwr(m) which are output by the scan line driving circuit 140 are logic signals which are defined by H or L level. For this reason, the scan line driving circuit 140 becomes an aggregate of CMOS logic circuits which are operated in accordance with the control signal Ctry. In addition, the data signals Vd(1) to Vd(n) which are output by the data line driving circuit 150 are analog signals, but the data line driving circuit 150 sequentially supplies, to 1 to n-th data lines 114, the data signal Vd supplied from the circuit module in accordance with the control signal Ctrx. For this reason, the data line driving circuit 150 has also the CMOS logic circuit. Meanwhile, the pixel circuits 110 has a plurality of transistors which will be described below, and in the present embodiment, a P-channel type and an N-channel type are mixed in the transistors.

For this reason, in the micro display 10 formed as the silicon substrate, a well region is formed as below.

Figure 4:
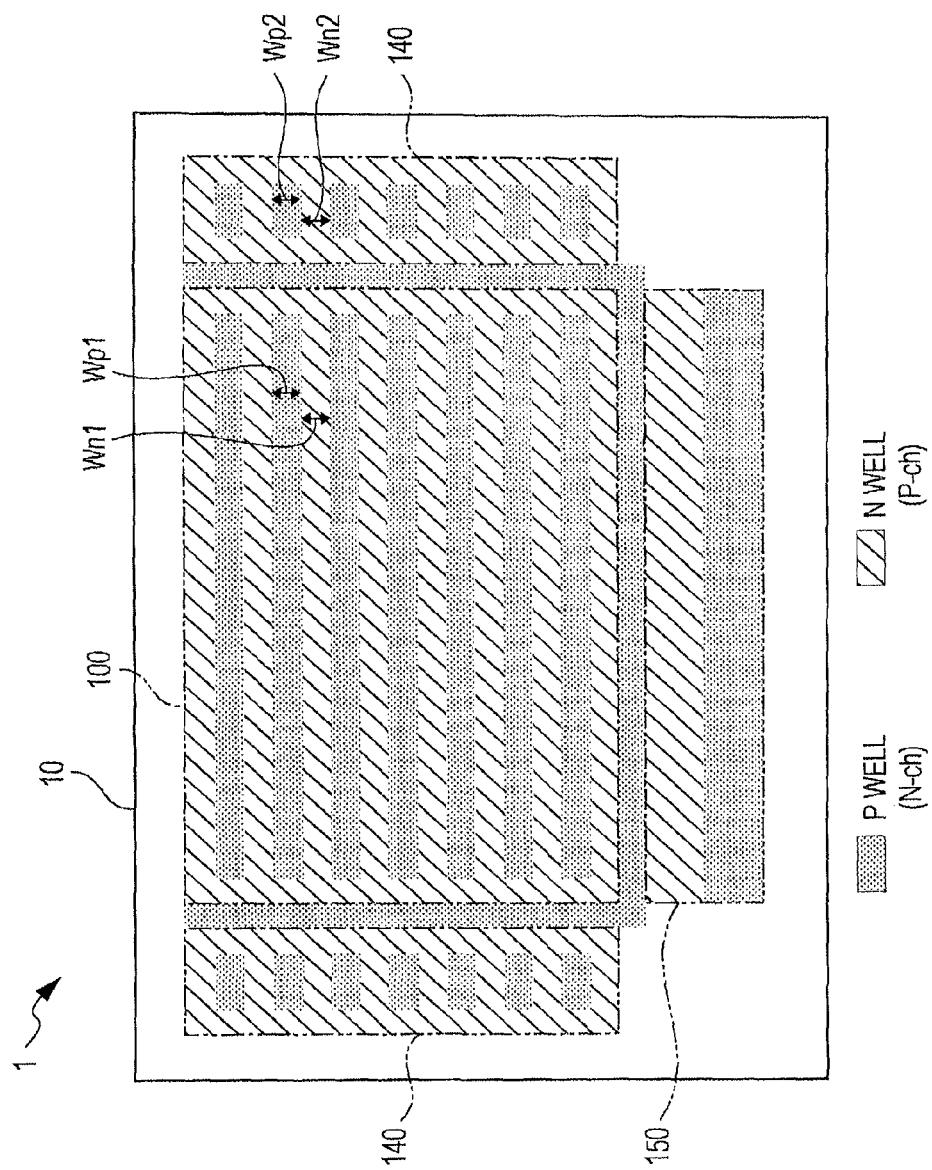
FIG. 4 is a view illustrating a well region in an electro-optical device.

FIG. 4 is a view illustrating a schematic disposition of a well region in the micro display 10. When a P type is used as the silicon substrate, an N type well region (hereinafter, roughly referred to as "N well") is formed as below.

That is, first, in a region where the display unit 100 is to be formed, an N well is formed along a plurality of belt-like opening portion extending in a transverse direction. Second, in a region where the scan line driving circuit 140 is to be formed, the N well is formed along a plurality of opening portions such as in the display unit 100 at almost the same pitch. Third, in a region where the data line driving circuit 150 is to be formed, the N well is formed on an upper side in FIG. 4, that is, on an opposite side of the display unit 100.

For this reason, consequentially, as shown the figure, in each of the opening portions in a region of the display unit 100 and a region of the scan line driving circuit 140, a P type well region (hereinafter, roughly referred to as "P well") remains. For this reason, in an edge portion between the region of the display unit 100 and the region of the scan line driving circuit 140, the N well is disposed in a frame shape, and the P well and the N well are alternately disposed inside the edge portion. In addition, the frame shaped N well surrounding the display unit 100 is separated from the N well facing the display unit 100 in the peripheral circuit by the P well.

Here, a width Wn1 of the N well in the display unit 100 and a width Wn2 of the N well in the scan line driving circuit 140 are formed to be equal to each other. In the same manner, a width Wp1 of the P well in the display unit 100 and a width Wp2 of the P well in the scan line driving circuit 140 may be formed to be equal to each other.

In addition, as shown in FIG. 4, the P wells in seven lines are arranged in each region of the display unit 100 and the scan line driving circuit 140; however, in the present embodiment, the P well and the N well adjacent to each other correspond to one line, and therefore, the P well and the N well in m lines which is the number of lines of the pixel circuits 110 are substantially disposed.

In addition, a blank portion in the figure is the P well when the P type is used for the silicon substrate, but because this is not related to the invention, the P well is shown as a blank.

Figure 5:
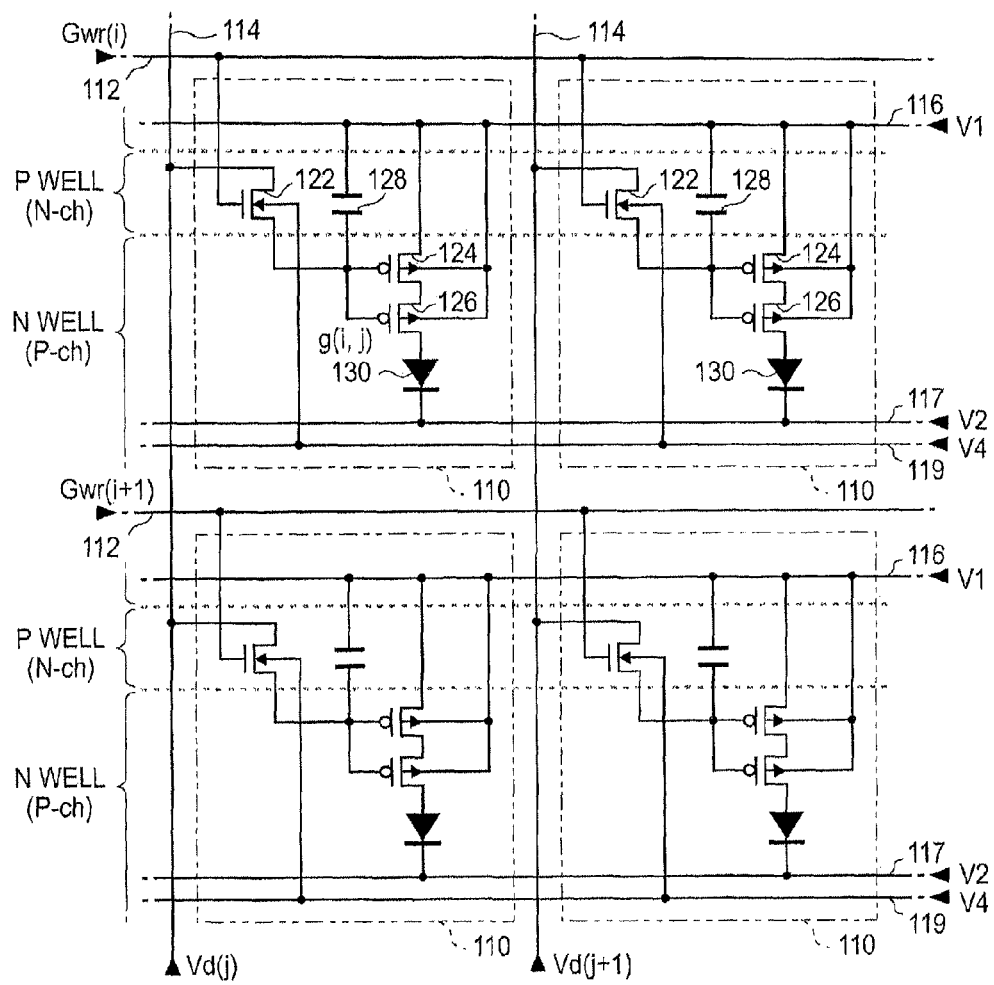
FIG. 5 is a view illustrating a pixel circuit in an electro-optical device.

FIG. 5 is a circuit diagram of the pixel circuit 110. In FIG. 5, the pixel circuits 110 for a total of four pixels of 2×2 according to intersections of the scan line 112 in i-th row and the scan line 112 in (i+1)-th row that is downwardly adjacent to the scan line 112 in i-th row, and the data line 114 in j-th column and the data line 114 in (j+1)-th column that is adjacent to the data line 114 in j-th column in the right side are illustrated. Here, i and (i+1) are signs of generally indicating lines in which the pixel circuits 110 are arranged, and are an integer≥1 and ≤m. In the similar manner, j and (j+1) are signs of generally indicating columns in which the pixel circuits 110 are arranged, and are an integer≥1 and ≤n.

As shown in FIG. 5, each of the pixel circuits 110 includes an N-channel MOS (Metal Oxide Semiconductor) transistor 122, P-channel MOS transistors 124 and 126, a capacitive element 128, and an OLED 130 that is a light emitting element. Each of the pixel circuits 110 has the same configuration in an electrical manner, and therefore, the pixel circuit 110 in i-th row and j-th column will be described as a representative.

The transistor 122 of the pixel circuit 110 in i-th row and j-th column acts as a switching transistor, and a gate node is formed through an insulating film on the P well of the silicon substrate although a structure of the transistor 122 is not particularly illustrated. In addition, two N-type diffusion layers are formed in a manner such that ions are implanted using the gate node as a mask, and a source node and a drain node are formed in such a manner that each of the diffusion layers are pulled out. In the transistor 122 having the above-described configuration, the gate node is connected to the scan line 112 in i-th row, an end of the drain node or the source node is connected to the data line 114 in j-th column, and the other end of the drain node or the source node is connected to an end of the capacitive element 128 and a common gate node of the transistors 124 and 126. In addition, a potential V4 is supplied to the P well of the transistor 122 through a power supply line 119. For this reason, a substrate potential of the transistor 122 (a first substrate potential) becomes the potential V4.

In each of the transistors 124 and 126, a common gate node is formed in a common N well region of the silicon substrate through the insulating film. In addition, in each of the regions corresponding to the transistors 124 and 126, two P-type diffusion layers are formed in a manner such that ions are implanted using the common gate node as a mask, and a source node and a drain node are formed in such a manner that each of the diffusion layers are pulled out.

Among these configurations, the source node of the transistor 124 is connected to a power supply line 116 for supplying the potential V1 on a higher position side of a power source together with the other end of the capacitive element 128, and the drain node of the transistor 124 is connected to the source node of the transistor 126. The drain node of the transistor 126 is connected to an anode of the OLED 130. In addition, the potential V1 is supplied to a common N well region of the transistors 124 and 126. For this reason, a substrate potential (a second substrate potential) of the transistors 124 and 126 becomes the potential V1.

In this manner, the transistors 124 and 126 connected in series act as a single driving transistor. Specifically, the driving transistor uses the common gate node of the transistors 124 and 126 as a gate, the source node of the transistor 124 as a source, the drain node of the transistor 126 as a drain so that a holding voltage by the capacitive element 128, that is, a current according to a voltage between the gate and the source flows to the OLED 130.

The anode of the OLED 130 is a pixel electrode (a first electrode) which is individually provided for each of the pixel circuits 110. Meanwhile, a cathode of the OLED 130 is a common electrode 117 (a second electrode) over all of the pixel circuits 110, and a potential V2 on a lower position side of a power source is supplied to the cathode. The OLED 130 is an element which includes the anode and the transparent cathode facing each other on the silicon substrate and which interposes a light emitting layer made of an organic EL material, and emits light with luminance according to a current flowing from the anode to the cathode.

In addition, in FIG. 5, each of Gwr(i) and Gwr(i+1) indicates a scanning signal supplied to the scan lines 112 in i-th row and (i+1)-th row, and each of Vd(j) and Vd(j+1) indicates a data signal supplied to the data lines 114 in j-th column and (j+1)-th column.

In addition, for convenience, in the pixel circuit 110 in i-th row and j-th column, the common gate node of the transistors 124 and 126 are represented as g(i, j).

Meanwhile, in regard to the capacitive element 128, capacity that is parasitic on the gate node of the transistors 124 and 126 may be used.

Figure 6:
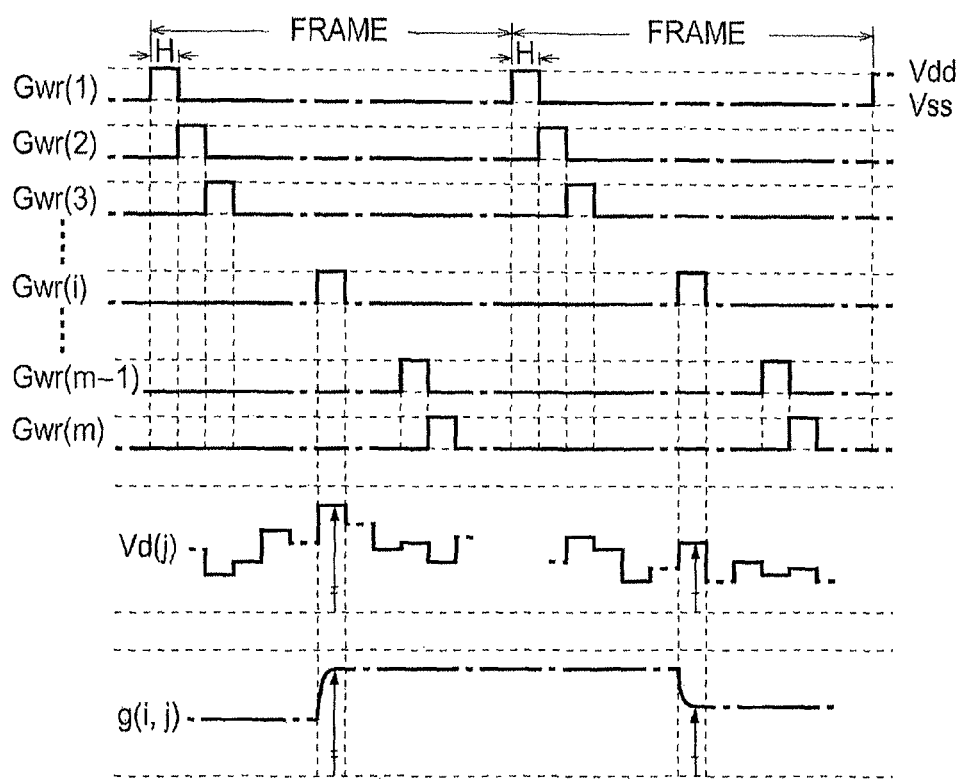
FIG. 6 is a view illustrating operation of an electro-optical device.

FIG. 6 is a view illustrating a display operation of the micro display 10, and illustrates an example of a waveform of each of a scanning signal and a data signal.

As shown in FIG. 6, scanning signals Gwr(1), Gwr(2), Gwr(3), . . . , Gwr(m−1), and Gwr(m) are sequentially selected for each horizontal scanning period (H) over each frame by the scan line driving circuit 140 to be exclusively in an H level. In addition, in the invention, the frame refers to a period required for displaying an image for one cut (frame) in the micro display 10. For example, when a vertical scanning frequency is 60 Hz, the frame refers to a period of 16.67 milliseconds equivalent to one period of the frequency. In addition, in the scan line driving circuit 140, a higher position side of a power source is a potential Vdd, and a lower position side thereof is a potential Vss. For this reason, in the scanning signals Gwr(1) to Gwr(m), an H level corresponds to the potential Vdd, and an L level corresponds to the potential Vss.

When the scan line 112 in i-th row is selected, and the scanning signal Gwr(i) is changed from the L level to the H level, in the data line 114 in j-th column, a data signal Vd(j) of a potential corresponding to a target value of luminance in i-th row and j-th column, that is, a potential corresponding to a driving current to flow to the OLED 130 is supplied to the data line 114 in j-th column by the data line driving circuit 150.

When the scanning signal Gwr(i) is in the H level in the pixel circuit 110 in i-th row and j-th column, the transistor 122 is turned on, and therefore, the gate node g(i, j) is electrically connected to the data line 114 in j-th column. For this reason, a potential of the gate node g(i, j) becomes a potential of the data signal Vd(j) as shown by an arrow in FIG. 6. In this instance, the transistors 124 and 126 flow, to the OLED 130, a current according to a difference in the potentials between the gate node g(i, j) and the source node and a voltage between the gate sources. In addition, the capacitive element 128 holds a voltage between the gate and the source in the transistors 124 and 126.

When the selection of the scan line 112 in i-th row is completed, and the scanning signal Gwr(i) is in the L level, the transistor 122 is turned from on to off. A potential of each of the gate node of the transistors 124 and 126 while a corresponding transistor 122 is in an on state is kept by the capacitive element 128 even though the transistor 122 is turned off. For this reason, even though the transistor 122 is turned off, the transistors 124 and 126 continuously flow, to the OLED 130, a current according to a holding voltage by the capacitive element 128 until the next scan line 112 in i-th row is repeatedly selected. For this reason, in the pixel circuit 110 in i-th row and j-th column, the OLED 130 continuously emits light over a period corresponding to one frame with luminance according to a potential of the data signal Vd(j) when the i-th row is selected.

Here, since the transistors 124 and 126 are the P-channel, as the potential of the data signal Vd(j) is on a lower position, the current flowing in the OLED 130 is increased (luminance becomes brighter).

In addition, even in the pixel circuits 110 in i-th row other than in the j-th column, the OLED 130 emits light with luminance according to the potential of the data signal supplied to the corresponding data line 114. In addition, the pixel circuit 110 corresponding to the scan line 112 in i-th row has been described; however, the scan lines 112 are selected in the order of 1, 2, 3, ..., (m−1), and m-th rows, and therefore, each of the pixel circuits 110 emits light with luminance according to each of target values. This operation is repeated for each frame.

In addition, in FIG. 6, a scale of the potential of the data signal Vd(j) and the gate node g(i, j) is enlarged than a potential scale of the scanning signal that is a logic signal for the sake of convenience.

However, in the pixel circuit 110, a role required for the transistor 122 acting as the switching transistor and a role for the transistors 124 and 126 acting as the driving transistor are different from each other as follows. Specifically, the transistor 122 requires that off resistance is high, that is, an off-leakage is small, and a variation amount of the gate potential of the transistors 124 and 126 is reduced, whereas the transistors 124 and 126 requires that the current to flow to the OLED 130 is stably supplied.

A substrate potential of the MOS transistor is generally configured so as to coincide with a source potential.

However, in the present embodiment, in order to reduce the off-leakage of the N-channel transistor 122, a substrate potential V4 of the transistor 122 is set as being the same as or slightly lower than a potential of a minimum value of the source potential of the transistor 122. Here, the substrate potential V4 of the transistor 122 is set as being the same as or slightly lower than the potential V2 on a lower position side of a power source. For this reason, the power supply line 119 for supplying the potential V4 is provided separately from the common electrode 117 which is kept at the potential V2. In addition, when reducing the substrate potential, a threshold voltage becomes higher, but in the present embodiment, priority is given to reducing the off-leakage based on the role required for the transistor 122. In addition, in the N-channel transistor, when the substrate potential is higher than the source potential, it is biased in the forward direction toward the N diffusion layer from the P well, and therefore, an operation failure occurs by the flow of a current.

Meanwhile, when the substrate potential of each of the P-channel transistors 124 and 126 is higher than the source node, influences of an increase in the threshold voltage cannot be ignored. In contrast, when the substrate potential is lower than the source node, an operation failure may occur. For this reason, the substrate potential of each of the P-channel transistors 124 and 126 has to coincide with the potential V1 of the source node.

Accordingly, in the present embodiment, the substrate potential of the transistor 122 and the substrate potential of each of the transistors 124 and 126 are appropriately set in accordance with each of the required roles, and therefore, it is possible to reduce the leakage in the transistor 122, and to stably supply the current to flow to the OLED 130 by the transistors 124 and 126.

However, in order to enable the OLED 130 to emit light with luminance of a certain degree, it is necessary to increase a power supply voltage, that is, a difference in the potentials V1 and V2. Meanwhile, as the current flowing to the OLED 130 is reduced, a voltage between the anode and the cathode (potential V2) of the OLED 130 is gradually reduced, and a voltage applied between the source and the drain of the driving transistor is gradually increased by that amount. Consequently, in a state in which the luminance of the OLED 130 is zero, the voltage applied between the source and the drain of the driving transistor becomes a maximum.

Here, in order to increase a voltage (withstand voltage) which can be applied between the source and the drain of the transistor formed on the silicon substrate, it is necessary to increase a size of the transistor to thereby reduce electric field density. However, when miniaturization of the display unit 100 or high definition display is required, the size of the transistor is inevitably reduced, and therefore, the withstand voltage is reduced. For this reason, in a configuration in which the number of driving transistors is 1, when making the OLED 130 emit light with low luminance, destruction may occur due to a voltage exceeding the lowered withstand voltage.

In other words, in the related art, there was a trade-off relationship between making the OLED 130 emit light with high luminance by increasing the power supply voltage, and the miniaturization of the display unit and the high definition display.

In this regard, in the present embodiment, a configuration in which the driving transistor is connected in series by two transistors 124 and 126. In this configuration, when the current does not flow to the OLED 130, the transistors 124 and 126 are turned off, so that the drain node of the transistor 124 and the source node of the transistor 126 are in a floating state. For this reason, the voltage is not applied between the source and the drain of the transistors 124 and 126. In addition, when an amount of the current flowing to the OLED 130 is reduced, a relatively high voltage is applied between the source node of the transistor 124 and the drain node of the transistor 126, but considering the voltage is divided into transistors 124 and 126, the high voltage is not applied.

Accordingly, it is unnecessary to increase the withstand voltage of the transistors 124 and 126.

As a result, in the present embodiment, by making the OLED 130 emit light with high luminance, both the miniaturization of the display unit and the high definition display may be achieved.

In addition, when making the OLED 130 emit light with high luminance or one of the miniaturization of the display unit and the high definition display is required, a single driving transistor may be provided.

In addition, in the present embodiment, the frame-like N well surrounding the display unit 100 is separated from the N well facing the display unit 100 in the peripheral circuit by the P well-positioned at a boundary portion. For this reason, the N well in the display unit 100 and the P well surrounded by the N well have difficulty in receiving interference due to operations of the scan line driving circuit 140 and the data line driving circuit 150 which are the peripheral circuits. In other words, since a local operation is constantly in progress by a clock or the like in the peripheral circuit, the peripheral circuit is the source of noise, but has a structure having difficulty in exerting influences of the corresponding noise on the display unit 100, by the P well provided in the boundary portion.

In the present embodiment, widths Wn1 and Wn2 of the N well are the same, and widths Wp1 and Wp2 of the P well are the same, and therefore, it is possible to simplify a process of forming the wells.

Application and Modification Example

The invention is not limited to the above-described embodiments, and a variety of application and modification examples which will be described below may be possible. In addition, it is possible to appropriately combine one or a plurality of application and modification examples which are arbitrarily selected.

Disposition of Well Region

In the present embodiment, as particularly shown in FIG. 5, the P well and the N well of the display unit 100 are formed for each row along a row direction, but the invention is not limited thereto. For example, the P well and the N well may be formed along a column direction.

Figure 7:
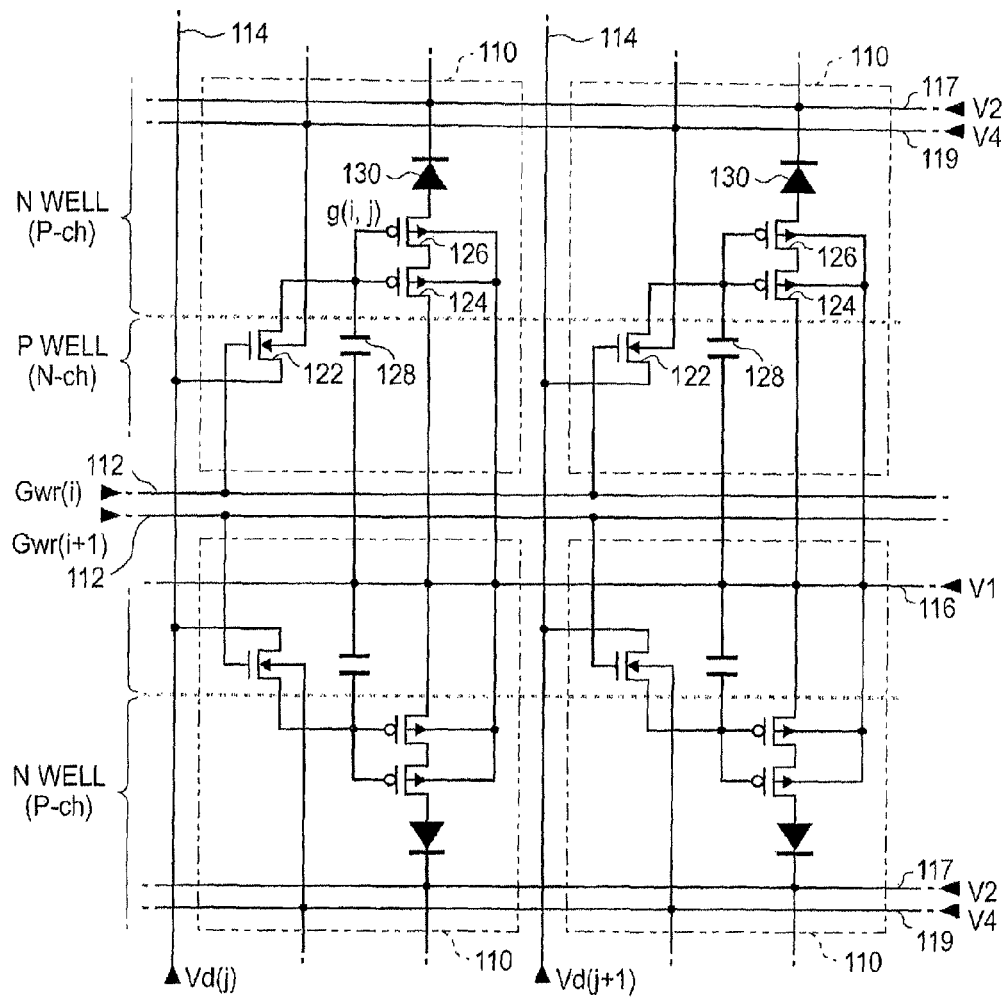
FIG. 7 is a view illustrating a pixel circuit of an electro-optical device according to application and modification examples.

In addition, different from each row, as shown in FIG. 7, each of the wells is alternately shared in an odd row and an even row adjacent to each other. In this manner, when each of the wells is alternately shared, the power supply line 116 is shared in, for example, i-th row and (i+1)-th row, and the power supply line 119 may be also shared in (i+1)-th row and (i+2)-th row which is not shown. Therefore, it is possible to easily achieve pitch narrowing. Channel type of transistor In the present embodiment, the N-channel transistor 122 is used as the switching transistor, and the P-channel transistors 124 and 126 are used as the driving transistor; however, the invention is not limited thereto. Therefore, in the following description, a variety of variation of channels of the switching transistor and the driving transistor will be described.

Figure 8:
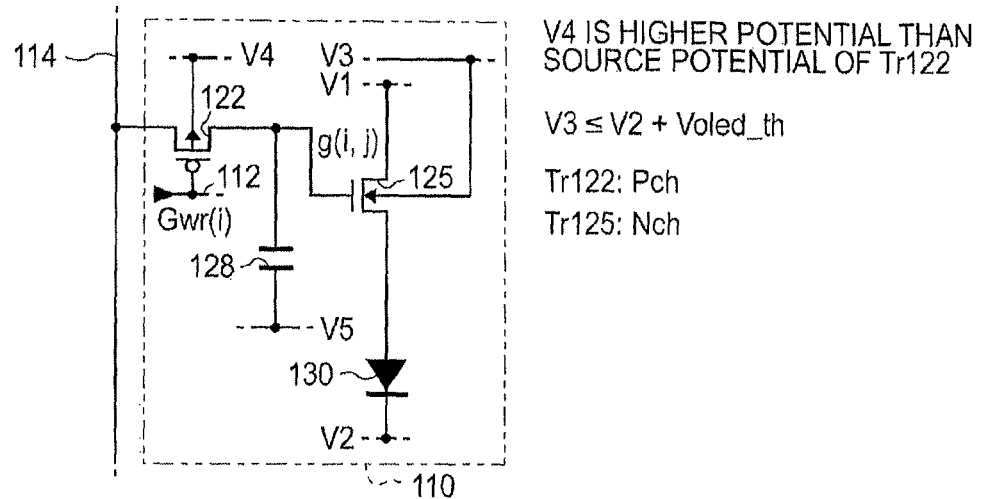
FIG. 8 is a view illustrating a pixel circuit of an electro-optical device according to application and modification examples.

In FIG. 8, a configuration in which the P-channel transistor 122 and a single N-channel transistor 125 as the driving transistor are provided, and a potential V5 is supplied to the other end of the capacitive element 128 is illustrated.

When the N-channel driving transistor is provided, the potential of the data signal Vd(j) becomes a higher position, the current flowing to the OLED 130 is increased (luminance becomes brighter). For this reason, in the configuration shown in FIG. 8, in order to reduce the off-leakage of the P-channel transistor 122, it is preferable that the substrate potential V4 of the transistor 122 be set as being a slightly higher value than a potential of a maximum value of the source potential of the transistor 122. Here, the substrate potential V4 of the transistor 122 may be set as being a slightly higher value than the potential V1 on the higher position side of the power source.

In addition, taking suppressing an operation failure with respect to the substrate potential V3 of the N-channel transistor 125 into account, it is preferable that the substrate potential V4 of the transistor 122 be set as being a minimum value (V2+Voled_th) of the source node, that is, less than a potential (V2+Voled_th) in which a luminescence threshold voltage Voled_th of the OLED 130 is added to a cathode potential V2 of the OLED 130.

Figure 9:
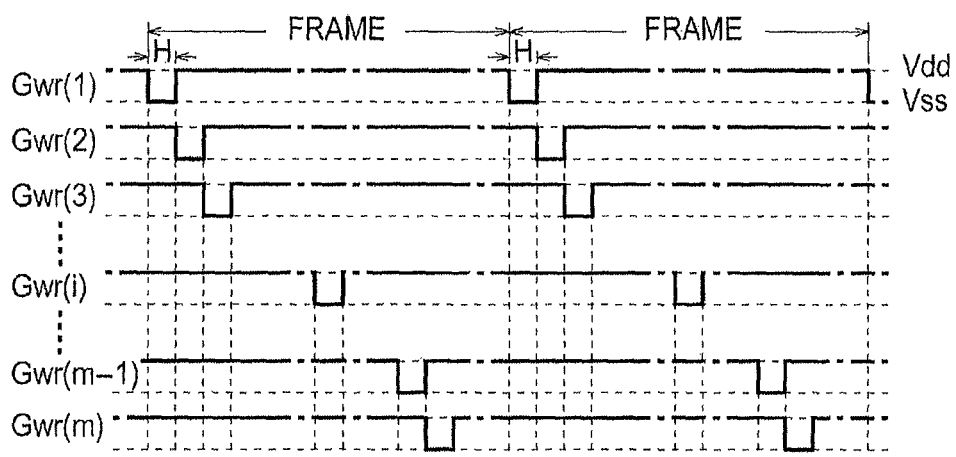
FIG. 9 is a view illustrating an operation of an electro-optical device according to application and modification examples.

In addition, when the P-channel transistor 122 is provided, the transistor 122 is turned on in the L level, so that the scanning signals Gwr(1), Gwr(2), Gwr(3), ..., Gwr (m−1), and Gwr(m) are sequentially selected for each horizontal scanning period (H) as shown in FIG. 9, and are exclusively in the L level.

Figure 10:
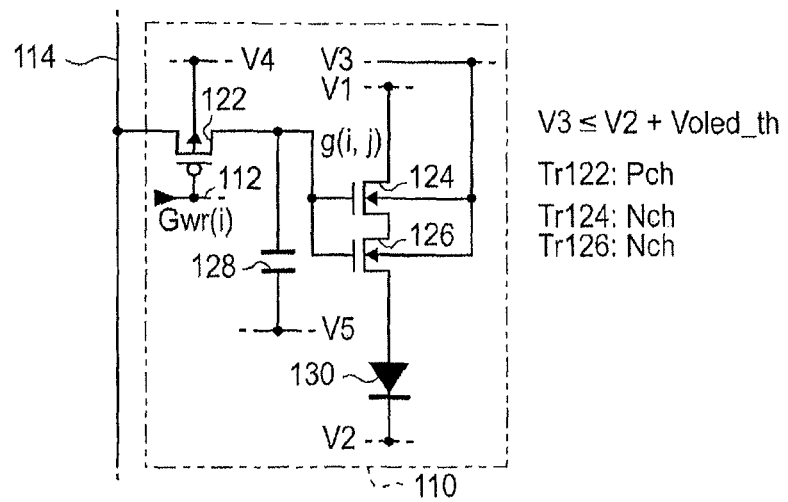
FIG. 10 is a view illustrating a pixel circuit of an electro-optical device according to application and modification examples.

In FIG. 10, the N-channel transistor 125 in FIG. 8 is serialized in the transistors 124 and 126 of the same channel. Each of the substrate potentials V3 and V4 has the same configuration as that of FIG. 8.

Figure 11:
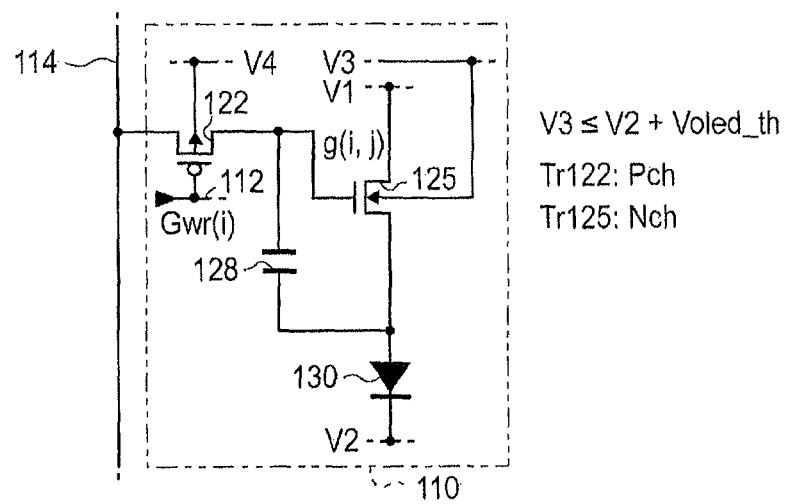
FIG. 11 is a view illustrating a pixel circuit of an electro-optical device according to application and modification examples.

In FIG. 11, the other end of the capacitive element 128 in FIG. 8 is connected to the source node of the transistor 125, and power supplying of the potential V5 is omitted. Each of the substrate potential V3 and V4 has the same configuration as that of FIG. 8.

Figure 12:
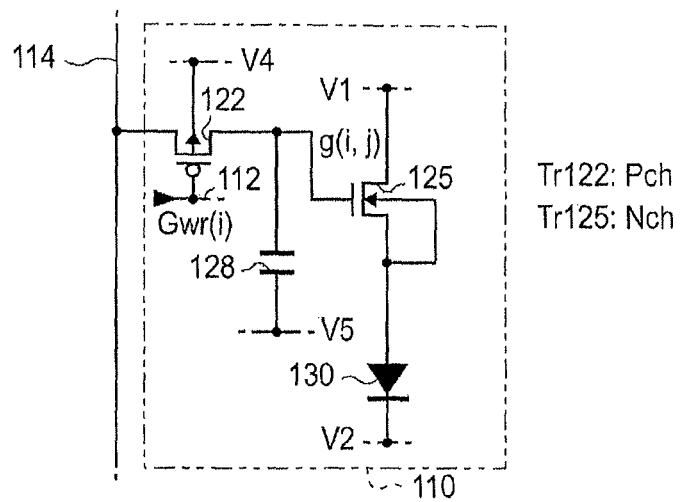
FIG. 12 is a view illustrating a pixel circuit of an electro-optical device according to application and modification examples.

In FIG. 12, the substrate potential of the transistor 125 in FIG. 8 is used as the source potential of the transistor 125, and power supplying of the potential V3 is omitted.

Figure 13:
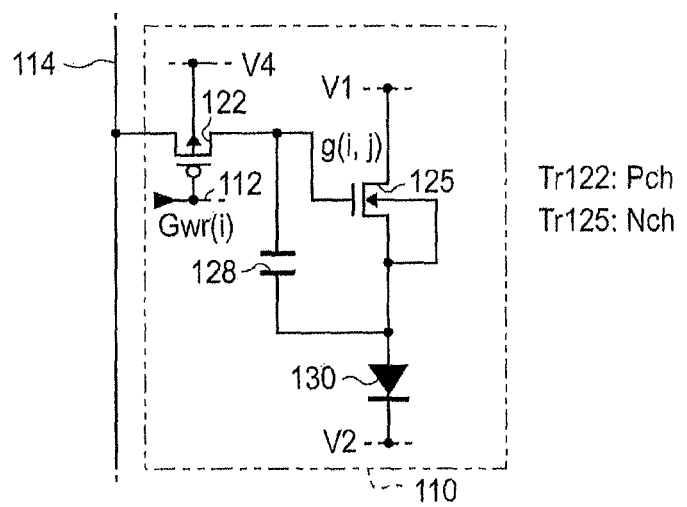
FIG. 13 is a view illustrating a pixel circuit of an electro-optical device according to application and modification examples.

In FIG. 13, the substrate potential of the transistor 125 in FIG. 11 is used as the source potential of the transistor 125, or the other end of the capacitive element 128 in FIG. 12 is connected to the source node of the transistor 125. In other words, in a configuration of FIG. 13, power supplying of the potentials V3 and V5 is omitted compared to a configuration of FIG. 8.

Figure 14:
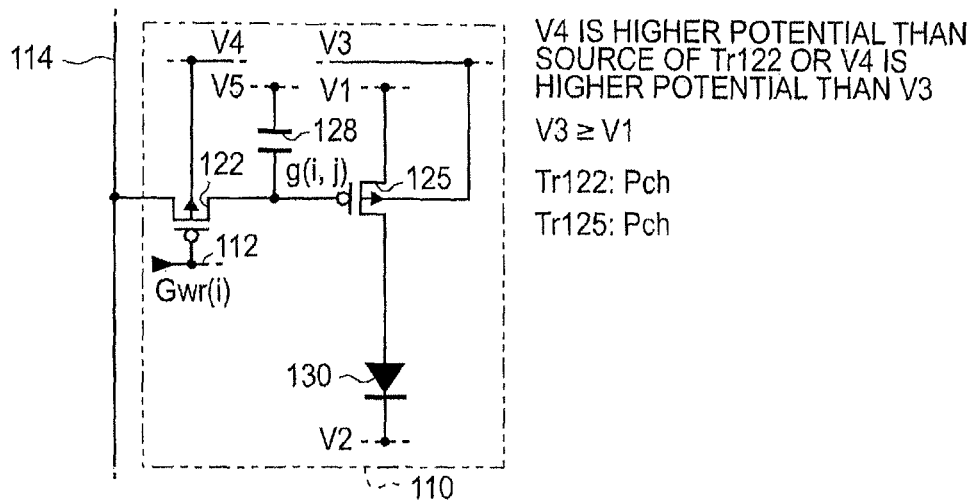
FIG. 14 is a view illustrating a pixel circuit of an electro-optical device according to application and modification examples.

In FIG. 14, the P-channel transistors 122 and 125 are illustrated. In a configuration of the P-channel transistors 122 and 125, only the N well may be formed in the display unit 100 of the silicon substrate.

When the P-channel transistor 122 is provided, it is preferable that the substrate potential V4 of the transistor 122 be set as being a slightly higher value than a potential of a maximum value of the source potential of the transistor 122 as described above. Here, each transistor generally included in the pixel circuit 110 is operated within the same voltage range. For this reason, the transistor 122 and the transistor 125 may be set to have the same substrate potential, and therefore, the substrate potential V4 of the transistor 122 and the substrate potential V3 of the transistor 125 may be the same potential. In the present embodiment, the transistor 122 requires smaller off-leakage than that of the transistor 125, so that the substrate potential V4 may be set higher than the substrate potential V3. In addition, the P-channel transistor 125 is provided, the substrate potential V3 of the transistor 125 may be set as being larger than the potential V1 of the source node.

In addition, the substrate potential V4 of the transistor 122 and the substantial potential V3 of the transistor 125 may be common.

Figure 15:
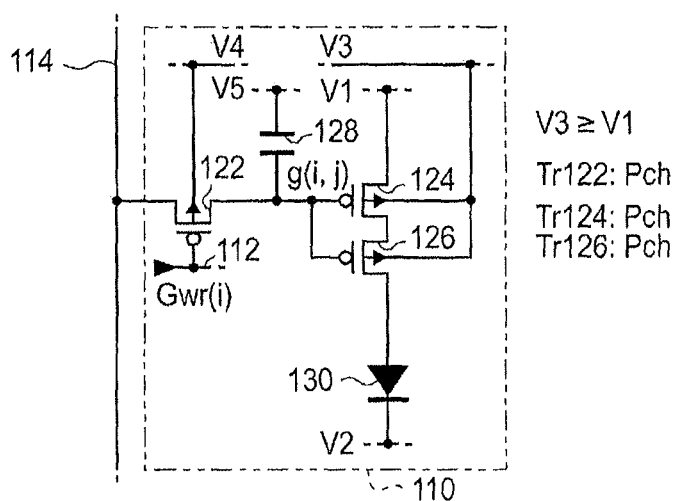
FIG. 15 is a view illustrating a pixel circuit of an electro-optical device according to application and modification examples.

In FIG. 15, the P-channel transistor 125 in FIG. 14 is serialized in the same channel transistors 124 and 126. Each of the substrate potentials V3 and V4 has the same configuration as that of FIG. 14.

Figure 16:
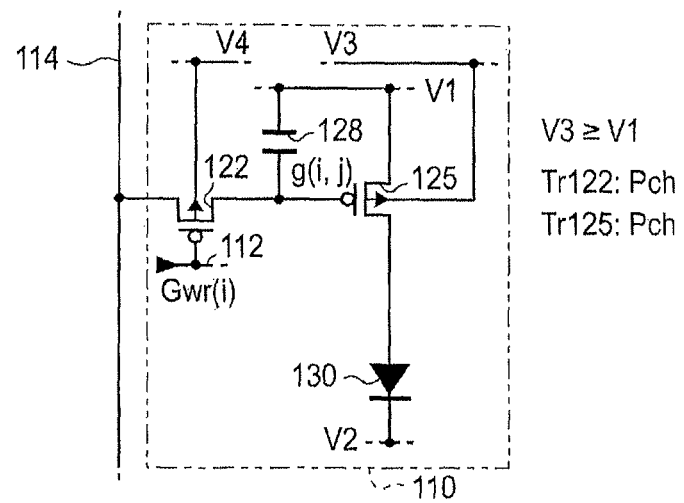
FIG. 16 is a view illustrating a pixel circuit of an electro-optical device according to application and modification examples.

In FIG. 16, the other end of the capacitive element 128 in FIG. 14 is connected to the source node of the transistor 125, and power supplying of the potential V5 is omitted. Each of the substrate potentials V3 and V4 has the same configuration as that of FIG. 14.

Figure 17:
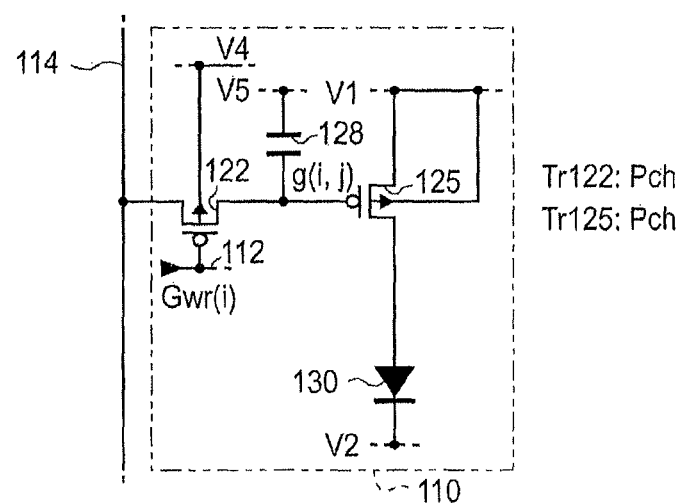
FIG. 17 is a view illustrating a pixel circuit of an electro-optical device according to application and modification examples.

In FIG. 17, the substrate potential of the transistor 125 in FIG. 14 is used as the potential V1 of the power supply line 116 connected to the source potential of the transistor 125, and power supplying of the potential V3 is omitted.

Figure 18:
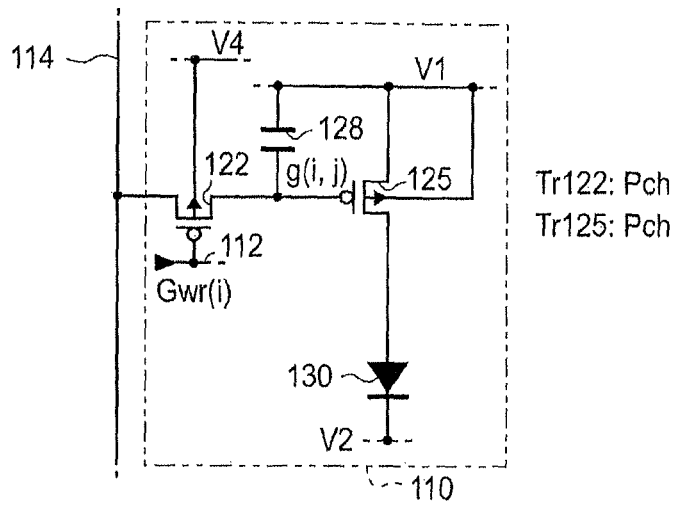
FIG. 18 is a view illustrating a pixel circuit of an electro-optical device according to application and modification examples.

In FIG. 18, the other end of the capacitive element 128 in FIG. 17 is connected to the source node of the transistor 125, and power supplying of the potential V5 in addition to the potential V3 is omitted.

Figure 19:
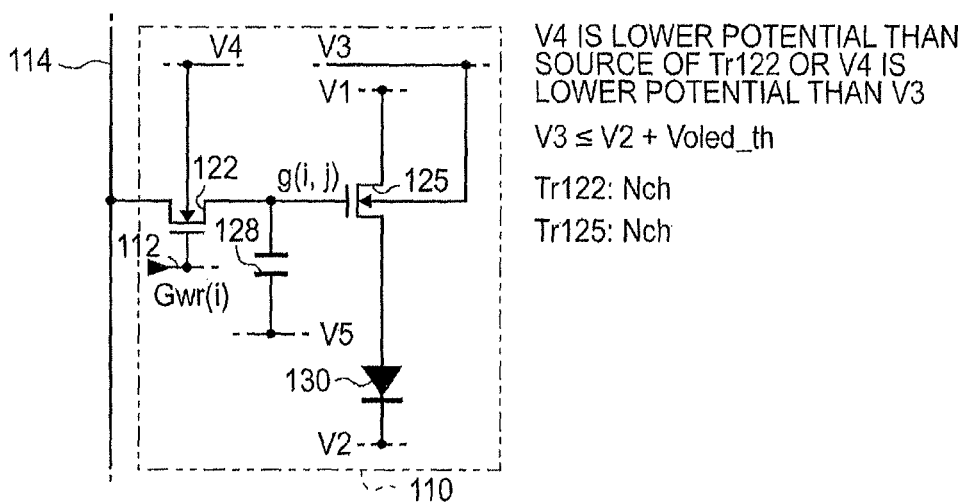
FIG. 19 is a view illustrating a pixel circuit of an electro-optical device according to application and modification examples.

In FIG. 19, the N-channel transistors 122 and 125 are provided. In a configuration of the N-channel transistors 122 and 125, when the silicon substrate is a P type, the silicon substrate may be used as the P well as is. It is preferable that the substrate potential V4 of the N-channel transistor 122 be the same as or slightly lower than the source potential of the transistor 122 as described above. Here, each transistor generally included in the pixel circuit 110 is operated within the same voltage range. For this reason, the transistor 122 and the transistor 125 may be set to have the same substrate potential, and therefore, the substrate potential V4 of the transistor 122 and the substrate potential V3 of the transistor 125 may be the same potential. In the present embodiment, the transistor 122 requires smaller off-leakage than that of the transistor 125, so that the substrate potential V4 may be set as being lower than the substrate potential V3. In addition, the substrate potential V3 of the N-channel transistor 125 may be set as being less than (V2+Voled_th) as described above.

In addition, the substrate potential V4 of the transistor 122 and the substantial potential V3 of the transistor 125 may be common.

Figure 20:
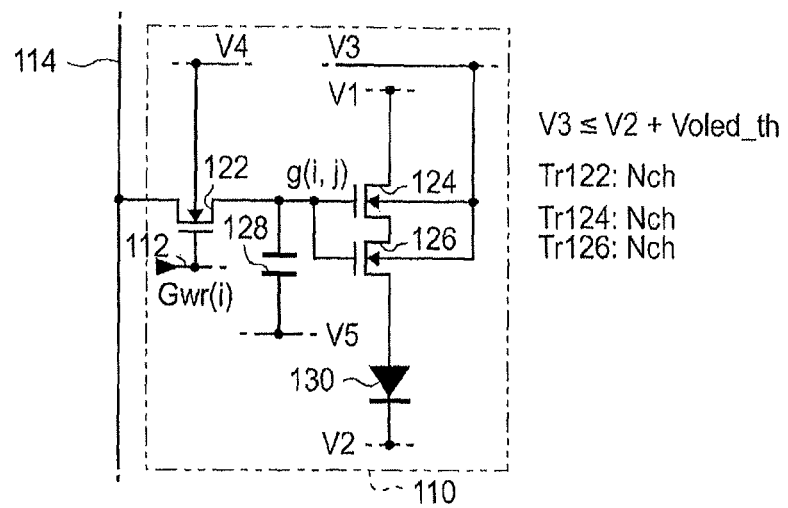
FIG. 20 is a view illustrating a pixel circuit of an electro-optical device according to application and modification examples.

In FIG. 20, the N-channel transistor 125 in FIG. 19 is serialized in the same channel transistors 124 and 126. Each of the substrate potentials V3 and V4 has the same configuration as that of FIG. 19.

Figure 21:
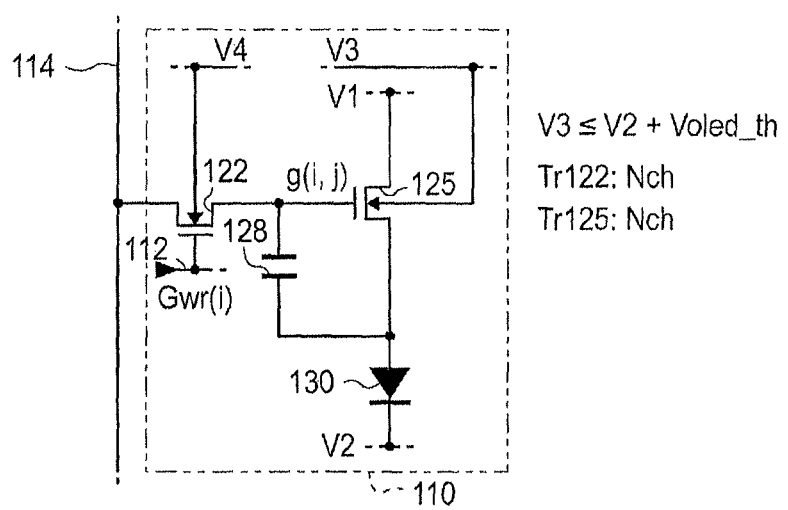
FIG. 21 is a view illustrating a pixel circuit of an electro-optical device according to application and modification examples.

In FIG. 21, the other end of the capacitive element 128 in FIG. 19 is connected to the source node of the transistor 125, and power supplying of the potential V5 is omitted. Each of the substrate potentials V3 and V4 has the same configuration as that of FIG. 19.

Figure 22:
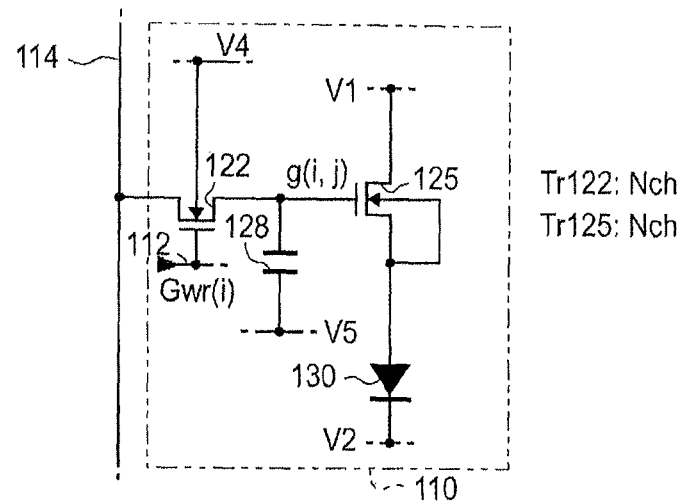
FIG. 22 is a view illustrating a pixel circuit of an electro-optical device according to application and modification examples.

In FIG. 22, the substrate potential of the transistor 125 in FIG. 19 is used as the source potential of the transistor 125, and power supplying of the potential V3 is omitted.

Figure 23:
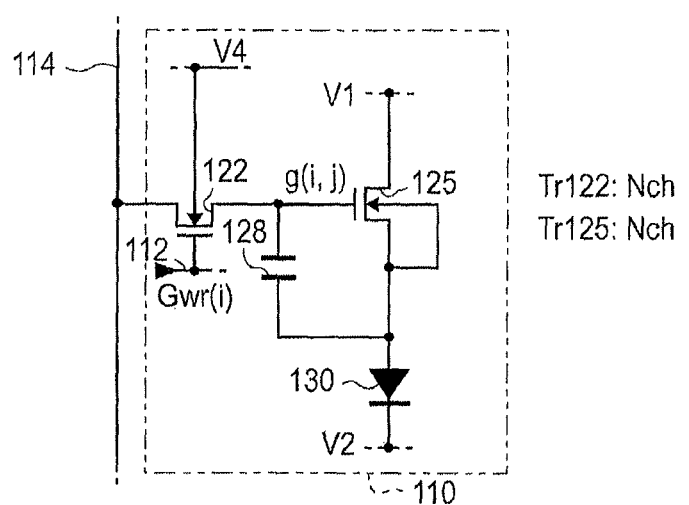
FIG. 23 is a view illustrating a pixel circuit of an electro-optical device according to application and modification examples.

In FIG. 23, the substrate potential of the transistor 125 in FIG. 21 is used as the source potential of the transistor 125, or the other end of the capacitive element 128 in FIG. 22 is connected to the source node of the transistor 125. In a configuration of FIG. 23, power supplying of the potentials V3 and V5 is omitted compared to the configuration of FIG. 19.

The Others

In the embodiments, the substrate potential of each of the transistors 124 and 126 are supplied by the power supply line 116, but may be supplied by a separate power supply line.

In addition, as the light emitting element, elements other than the OLED may be used. For example, an inorganic light emitting diode (LED) may be used. In addition, in a case in which the driving transistor is connected in series, at least three light emitting elements may be used.

Electronic Apparatus

Next, a head mounted display adopting the micro display 10 according to the embodiments will be described.

Figure 24:
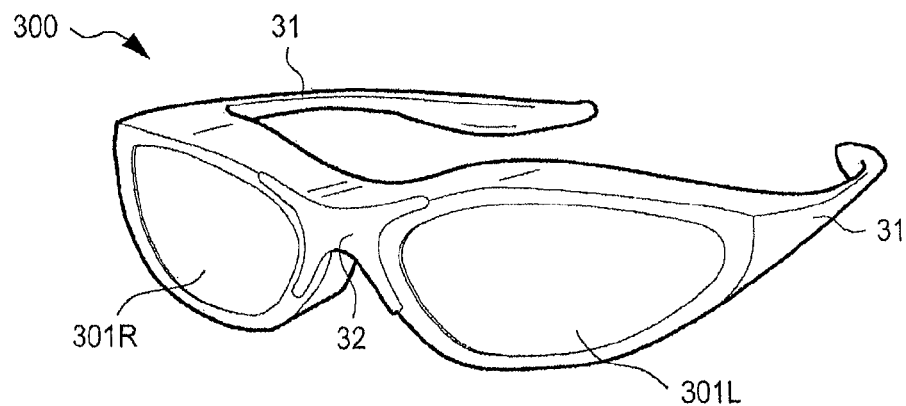
FIG. 24 is a perspective view illustrating an HMD using an electro-optical device according to an embodiment of the invention.
Figure 25:
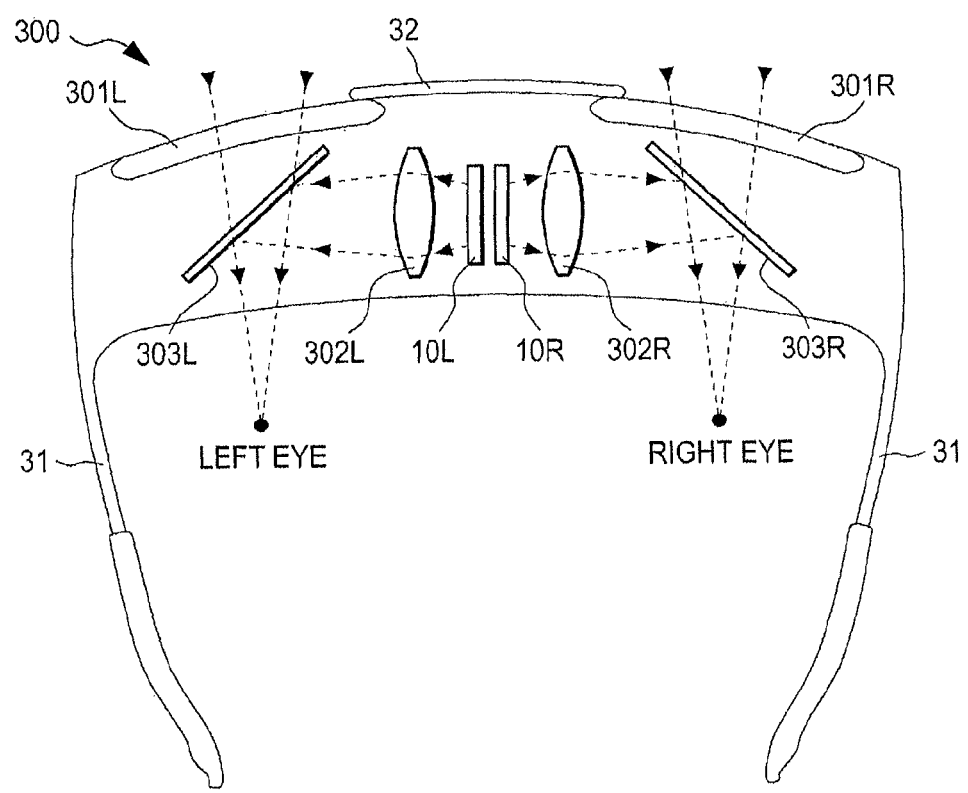
FIG. 25 is a view illustrating an optical configuration of an HMD.

FIG. 24 is a diagram illustrating an appearance of a head mounted display, and FIG. 25 is a diagram illustrating an optical configuration of the head mounted display.

First, as shown in FIG. 24, a head mounted display 300 includes a temple 31, a bridge 32, and lenses 301L and 301R in appearance. In addition, as shown in FIG. 25, in the head mounted display 300, a micro display 10L for a left eye and a micro display 10R for a right eye are provided in the vicinity of the bridge 32 and on the interior side (a lower side in the figure) of the lenses 301L and 301R.

An image display surface of the micro display 10L is disposed so as to be on the left side in FIG. 25. Due to this, a display image by the micro display 10L is emitted in the direction of 9 o'clock in the figure through an optical lens 302L. A half mirror 303L reflects the display image by the micro display 10L in the direction of 6 o'clock, and transmits light incident from the direction of 12 o'clock.

The image display surface of the micro display 10R is disposed so as to be on the right side opposite to the micro display 10L. Due to this, the display image by the micro display 10R is emitted in the direction of 3 o'clock in the figure through the optical lens 302R. A half mirror 303R reflects the display image by the micro display 10R in the direction of 6 o'clock, and transmits light incident from the direction of 12 o'clock.

In this configuration, a wearer of the head mounted display 300 may see the display images by the micro displays 10L and 10R in a see-through condition in which the display images are superimposed on an external video.

In addition, in the head mounted display 300, when a left-eye image of both-eye images accompanying different parallaxes is displayed on the micro display 10L, and a right-eye image is display on the micro display 10R, the display images may be perceived by the wearer as if the display images have a sense of depth or a three-dimensional effect (3D display).

In addition, the micro display 10 may be applicable as an electronic viewfinder in a video camera, a lens replacement type digital camera, and the like other than the head mounted display 300.

The entire disclosure of Japanese Patent Application No. 2011-166576, filed Jul. 29, 2011 and 2012-104847, filed May 1, 2012 are expressly incorporated by reference herein.

What is claimed is:

1. An electro-optical device, the electro-optical device including;
   a semiconductor substrate having a first well having a first conductivity type, a second well having the first conductivity type, a third well having a second conductivity type different from the first conductivity type, and a fourth well having the second conductivity type, wherein the first well, the second well, the third well, and the fourth well are each defined as a region of doping on the substrate that extends in a transverse direction on the substrate so as to be an area that is greater than an electronic component disposed in each respective region;
   a first scan line and a second scan line that extend in a first direction;
   a data line extending in a second direction;
   a first light emitting element having a first electrode;

a first driving transistor that controls a first current in accordance with a first potential of a first gate node while being electrically connected to the first electrode of the first light emitting element during a period when the first current is supplied to the first light emitting element, the first driving transistor being formed in the first well;

a first switching transistor that is electrically connected between the first gate node of the first driving transistor and the data line and that has a second gate node electrically connected to the first scan line, the first switching transistor formed in the third well;

a second light emitting element having a second electrode;

a second driving transistor that controls a second current in accordance with a second potential of a third gate node while being electrically connected to the second electrode of the second light emitting element during a period when the second current is supplied to the second light emitting element, the second driving transistor being formed in the second well;

a second switching transistor that is electrically connected between the third gate node of the second driving transistor and the data line and that has a fourth gate node electrically connected to the second scan line, the second switching transistor being formed in the fourth well, wherein the first scan line and the second scan line are disposed between the first well and the second well, and wherein the third well and the fourth well are disposed between the first well and the second well.

2. The electro-optical device according to claim 1,
wherein a first substrate potential, which is greater than 0 volts, is supplied to the first switching transistor and the second switching transistor, and
wherein a second substrate potential, different from the first substrate potential, and also greater than 0 volts, is supplied to the first driving transistor and the second driving transistor.

3. The electro-optical device according to claim 2,
wherein the first light emitting element and the first driving transistor are connected in series between a first potential and a second potential, and the second substrate potential is a common potential with a source node of the first driving transistor.

4. The electro-optical device according to claim 1, further including a power supply line for supplying a first potential,
wherein one of a source node and a drain node of the first driving transistor is connected to the first electrode of the first light emitting element,
wherein the other of the source node and the drain node of the first driving transistor is connected to the power supply line,
wherein one of a source node and a drain node of the second driving transistor is connected to the second electrode of the second light emitting element,
wherein the other of the source node and the drain node of the second driving transistor is connected to the power supply line, and
wherein the second substrate potential is a common potential with the first potential.

5. The electro-optical device according to claim 1,
wherein the first switching transistor electrically connects the first gate node of the first driving transistor and the data line when the first scan line is selected, and
wherein a scan line driving circuit for driving the first scan line and the second scan line and a data line driving circuit for driving the data line are formed on the semiconductor substrate.

6. The electro-optical device according to claim 5,
wherein a separation well is formed between a display unit in which the first driving transistor and the second driving transistor are provided and a peripheral circuit in which the scan line driving circuit and the data line driving circuit are provided.

7. The electro-optical device according to claim 1,
wherein the first switching transistor and the second switching transistor are an N-channel transistors, and
wherein the first substrate potential is lower than a source potential of the first switching transistor and a source potential of the second switching transistor.

8. The electro-optical device according to claim 2,
wherein the first switching transistor and the second switching transistor are N-channel transistors, and
wherein the first substrate potential is lower than a minimum value of a source potential of the first switching transistor and a minimum value of a source potential of the second switching transistor.

9. The electro-optical device according to claim 2,
wherein the first switching transistor and the first driving transistor are P-channel transistors, and
wherein the first substrate potential is higher than a source potential of the first switching transistor and a source potential of the first driving transistor.

10. The electro-optical device according to claim 2,
wherein the first switching transistor and the first driving transistor are P-channel transistors, and
wherein the first substrate potential is higher than a maximum value of a source potential of the first switching transistor and a maximum value of a source potential of the first driving transistor.

11. An electronic apparatus comprising the electro-optical device according to claim 1.

12. An electronic apparatus comprising the electro-optical device according to claim 2.

13. An electronic apparatus comprising the electro-optical device according to claim 3.

14. An electronic apparatus comprising the electro-optical device according to claim 4.

15. An electronic apparatus comprising the electro-optical device according to claim 5.

16. An electronic apparatus comprising the electro-optical device according to claim 6.

17. An electronic apparatus comprising the electro-optical device according to claim 7.

18. An electronic apparatus comprising the electro-optical device according to claim 8.

19. An electronic apparatus comprising the electro-optical device according to claim 9.

20. An electronic apparatus comprising the electro-optical device according to claim 10.

* * * * *